United States Patent [19]
Rao et al.

[11] Patent Number: 5,355,014
[45] Date of Patent: Oct. 11, 1994

[54] SEMICONDUCTOR DEVICE WITH INTEGRATED RC NETWORK AND SCHOTTKY DIODE

[76] Inventors: Bhasker Rao, 5881 W. Orchid La., Chandler, Ariz. 85226; Horst Leuschner, 8701 Camino Vivaz, Scottsdale, Ariz. 85255; Ashok Chalaka, 462 Tigerwood Way, San Jose, Calif. 95111

[21] Appl. No.: 25,600

[22] Filed: Mar. 3, 1993

[51] Int. Cl.$^5$ .................. H01L 27/06; H01L 29/08; H01L 29/48
[52] U.S. Cl. .................. 257/533; 257/535; 257/537; 257/476; 437/60; 437/918; 437/919
[58] Field of Search .............. 257/355, 359, 362, 516, 257/533, 536, 532, 535, 476, 154, 360, 379, 380, 577, 904; 437/47, 60, 918, 919

[56] References Cited
U.S. PATENT DOCUMENTS 4,170,017 10/1979 Klein et al. .................. 257/477
5,047,826 9/1991 Keller et al. .................. 257/52
5,218,222 6/1993 Roberts .................. 257/362
5,227,012 7/1993 Brandli et al. .................. 156/643

Primary Examiner—Robert Limanek
Assistant Examiner—David B. Hardy
Attorney, Agent, or Firm—Flehr, Hohbach, Test, Albritton & Herbert

[57] ABSTRACT

A semiconductor device which has a resistor, a capacitor, and a Schottky diode all formed on a single semiconductor substrate. The capacitor comprises a dielectric region between two metal regions. The resistor comprises an N+-type well. The Schottky diode comprises an N-type tub, a metal region in contact with the tub, and an N+-type region formed in the N-type tub. The resistor and capacitor are coupled by a metal region which contacts one of the metal regions of the capacitor and the N+-type well of the resistor. The resistor and Schottky diode are coupled by a metal region which contacts the N+-type well of the resistor and the N+-type well of the Schottky diode.

29 Claims, 5 Drawing Sheets

FIG.—1 ns014

SEMICONDUCTOR DEVICE WITH INTEGRATED RC NETWORK AND SCHOTTKY DIODE

FIELD OF THE INVENTION

The present invention relates generally to integrated semiconductor devices. In particular, it relates to semiconductor devices having resistor and capacitor (RC) networks integrated with Schottky diodes on a single semiconductor substrate.

BACKGROUND OF THE INVENTION

In the past, RC networks and Schottky diodes have been used together in filter circuits. Such filter circuits are typically used to reduce electromagnetic and radio frequency interference (EMI/RFI) produced by computers and computer accessories.

These computers and accessories are routinely operated only a short distance away from telecommunication equipment. For example, a personal computer is often operated in close proximity to a television set and computers in police cars are operated side by side with police communication gear. Many of these computers have high clock rates and digital signals whose rise and fall times are extremely short. In addition, many computer accessories operate at similarly high speeds. For example, memory cards, video accelerator cards, modems, fax boards, co-processor cards, and data compression hardware all operate at very high frequencies. As a result, the high speed data lines in these computers and accessories produce EMI/RFI.

Without additional counter measures, these popular and widespread computers and accessories would contaminate the air waves and interfere with communication equipment. For example, cordless telephones, cellular telephones, radios, televisions, and burglar alarms could all be affected. Furthermore, important non-communication equipment, like pacemakers or other medical equipment, could also be impacted.

Therefore, it is desirable to have counter measures which suppress the EMI/RFI produced by the high speed data lines in computers and computer accessories. However, it is also desirable that such counter measures are inexpensive, occupy little space, ensure proper testing, and produce only small delays.

In the past, several techniques have been used for shielding high speed data lines. However, these methods have not proven to be effective at optimizing cost, size, ease of testing, minimization of delays, and suppression of EMI/RFI.

One method has utilized metallic shielding with feed through capacitors coupled to the high speed data lines. However, this method is expensive. Furthermore, it is no longer feasible in light of the need for portable computers and computer accessories and the availability of light weight plastic enclosures.

Another method has been to simply use low pass integrated RC filters produced by thin film techniques. The use of a resistor in series with a capacitor limits the maximum attenuation at higher frequencies to a constant value. However, such filters do not effectively suppress EMF/RFI produced by signal ringing on a transmission line.

Signals generally travel from one side of a transmission line to the other side. If the circuitry at the other end does not match the characteristic impedance of the transmission line, some of the signal amplitude can be reflected. This reflected signal can have the same or opposite polarity, depending on whether the mismatch is because of lower or higher impedance. As a result, signal ringing with undershoots or overshoots will occur. This signal ringing contributes to the radiation of EMI/RFI.

Negative undershoots are more likely to occur than positive overshoots. This is due to the fact that, in semiconductor technology, n-channel MOS transistors and NPN bipolar transistors are faster, more powerful, and therefore more commonly used than p-channel MOS transistors and PNP bipolar transistors.

To suppress signal ringing with undershoots, Schottky diodes can be connected in parallel with a low pass RC filter. The cathode of the diode is connected to the transmission line and the anode is connected to ground. For normal signal levels on the transmission line, the Schottky diode is reverse biased and does not conduct current. However, negative undershoots exceeding the forward diode knee voltage are clamped and limited in amplitude.

A Schottky diode is more effective than a regular junction diode at suppressing negative undershoots for two reasons. First, it has a lower knee voltage and therefore limits undershoots to a smaller amplitude. In other words, it suppresses ringing to a greater extent than does a junction diode. And second, unlike the junction diode, the Schottky diode has no carrier storage and therefore provides for a clean signal clipping of high frequency ringing.

In the past, Schottky diodes have only been used as discrete circuit elements in these filter circuits. Because of this, these filter circuits are costly to produce, occupy a great deal of space, require extra connections for testing, and have significant delays due to large spacing between elements.

Although Schottky diodes have been used as collector-base clamping diodes in Schottky-TTL technology, to date, they have not been integrated with RC networks on a single integrated circuit chip. This stems from the difficulty in producing such a chip by combining the techniques used for forming RC networks with the techniques used for forming Schottky diodes.

OBJECTS OF THE INVENTION

It is an object of the invention to provide an integrated semiconductor device which has an RC network integrated with a Schottky diode.

It is another object of the invention to provide an integrated semiconductor device for reducing EMF/RFI which has an RC network integrated with a Schottky diode.

It is still another object of the invention to provide an integrated semiconductor device which is cost effective to produce and which has an RC network integrated with a Schottky diode.

It is further an object of the invention to provide an integrated semiconductor device which occupies a minimum amount of space and which has an RC network integrated with a Schottky diode.

It is still further an object of the invention to provide an integrated semiconductor device which can be tested as one entity without requiring connections of discrete elements and which has an RC network integrated with a Schottky diode.

It is yet another object of the invention to provide an integrated semiconductor device which has minimal delays due to the proximity of the circuit elements and which has an RC network integrated with a Schottky diode.

SUMMARY OF THE INVENTION

The foregoing and other objects of the invention may generally be achieved by a semiconductor device which has a resistor, a capacitor, and a Schottky diode all formed on a single semiconductor substrate. The resistor and the capacitor are coupled together in series. The Schottky diode is coupled in parallel to this in series connection.

The capacitor comprises a dielectric region sandwiched by two metal regions. The resistor comprises an N+-type well. The Schottky diode comprises an N-type tub, a metal region in contact with the tub, and an N+-type region formed in the N-type tub.

The resistor and capacitor are coupled by a metal region which contacts one of the metal regions of the capacitor and the N+-type well of the resistor. The resistor and Schottky diode are coupled by a metal region which contacts the N+-type well of the resistor and the N+-type well of the Schottky diode.

BRIEF DESCRIPTION OF THE DRAWINGS

The foregoing and other objects of the invention will become apparent in reading the following detailed description and in reference to the following drawings, in which.

DESCRIPTION OF THE PREFERRED EMBODIMENT

FIGS. 1-5 illustrate a semiconductor device 10 in accordance with the present invention. In these figures, like components are designated by like numerals.

Figure 1:
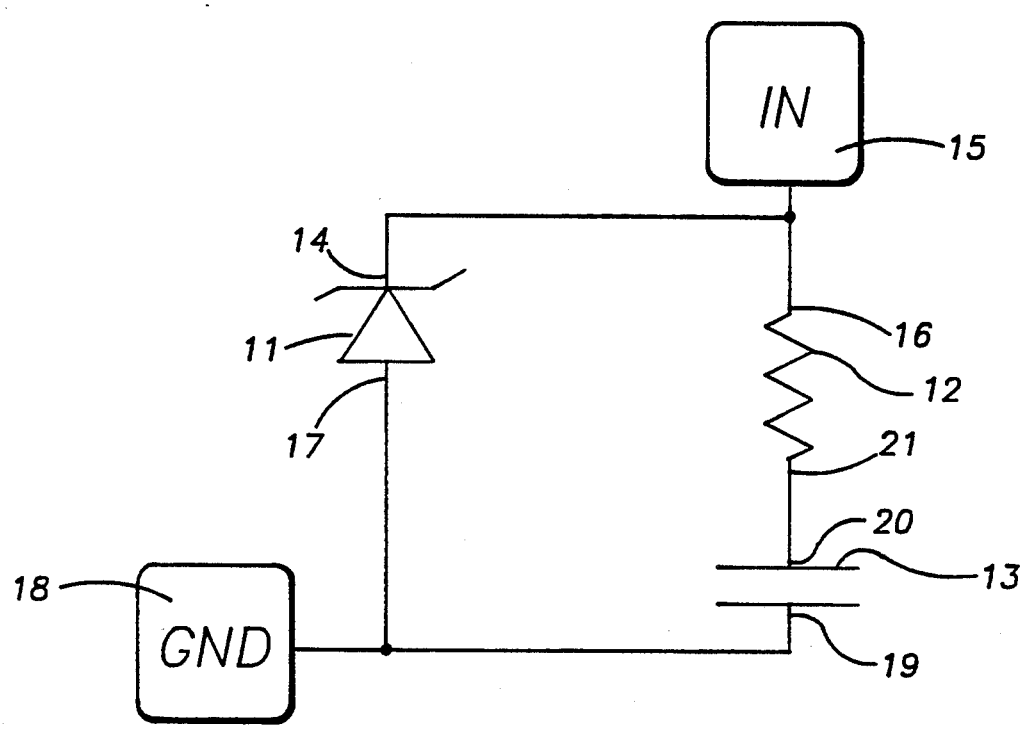
FIG. 1 shows a general circuit schematic of the present invention.

FIG. 1 provides a general circuit schematic of the semiconductor device 10. The Schottky diode 11 is coupled in parallel to resistor 12 and capacitor 13. Resistor 12 and capacitor 13 are coupled in series.

The cathode 14 of Schottky diode 11 is coupled to the input terminal 15 and to the terminal 16 of resistor 12. The anode 17 of Schottky diode 12 is coupled to the ground terminal 18 and to the terminal 19 of capacitor 13. The terminal 20 of capacitor 13 is coupled to the terminal 21 of resistor 12.

Figure 2:
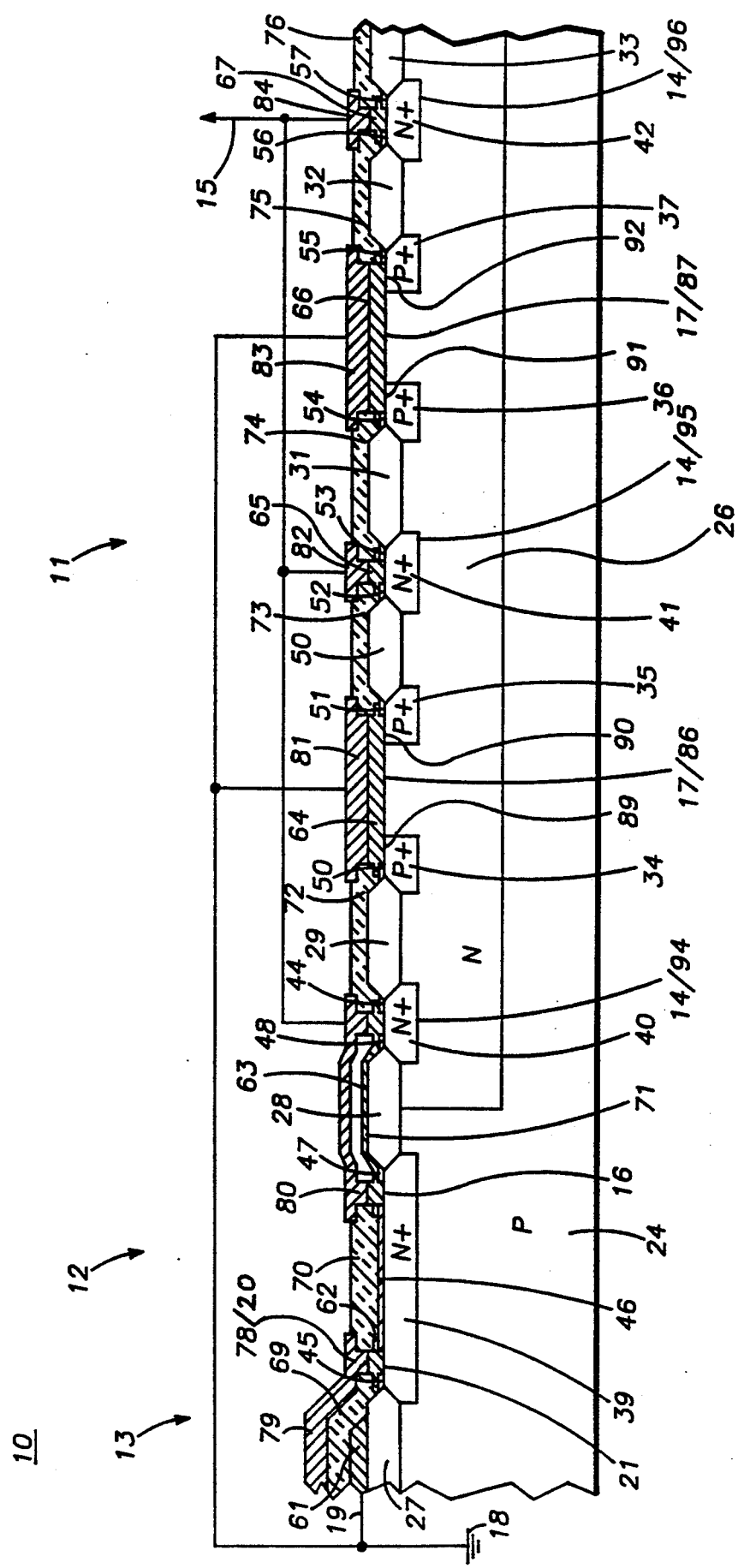
FIG. 2 shows a layout of the present invention employing inter-digitized Schottky contact area.

FIG. 2 provides a cross sectional layout of the preferred embodiment of the semiconductor device 10. The layout shows the Schottky diode 11, the resistor 12, and the capacitor 13 formed into a monolithic integrated circuit on a single semiconductor substrate 24. The following discussion details the processes, the materials, and the connections used in producing this layout.

The substrate 24 is a P-type silicon material having a bulk resistivity of approximately 25-50 ohm cm. A lightly doped N-type tub 26 is then formed in the P-type substrate by implanting and/or diffusing a suitable impurity. In the preferred embodiment this impurity is phosphorous with a doping concentration of approximately $1 \times 10^{12}$ cm$^{-3}$. The N-tub 26 extends approximately 4 $\mu$m into the P-type substrate 24.

A dielectric material is then selectively grown on the substrate 24 by conventional techniques for providing field isolation. In the preferred embodiment this material is silicon dioxide and is grown to have a thickness of approximately 1.3 $\mu$m. The resulting field oxide regions 27-33 provide the field isolation.

Heavily doped P+-type wells 34-37 and heavily doped N+-type wells 39-42 are then formed by conventional techniques used for implanting impurities. In the preferred embodiment, the P+-type wells 34-37 are formed by implanting boron into the N-type tub 26 with a doping concentration of approximately $1 \times 10^{14}$ cm$^{-3}$. The P+-type wells 34-37 extend approximately 0.5 $\mu$m into the N-type tub 26. Also, in the preferred embodiment, the N+-type wells 39-42 are formed by implanting arsenic with a doping concentration of approximately $1 \times 10^{16}$ cm$^{-3}$. The N+-type wells 39-42 extend approximately 0.3 $\mu$m into the N-type tub 26.

Another dielectric material such as silicon dioxide is then grown across the entire surface of the substrate 24. This layer is grown to have a thickness of approximately 0.2 $\mu$m. This layer is then selectively etched so that a first metal layer can be deposited onto selected areas of the N-type tub 26, the N+-type wells 39-42, and the P+-type wells 34-37. The remaining regions of this oxide layer are the oxide strips 45-57.

After the second oxide layer is etched, the first metal layer is deposited across the entire surface. In the preferred embodiment, this metal layer is aluminum and is deposited with a thickness of approximately 1 $\mu$m. This first metal layer is then selectively etched to form the metal regions 61-67.

A suitable dielectric material is then deposited across the entire surface. In the preferred embodiment, this dielectric layer is silicon nitride and is deposited with a thickness of 0.2 $\mu$m. This dielectric layer is then selectively etched so that a second metal layer can be deposited onto the dielectric itself and onto the metal regions 61-67. The regions which remain are the dielectric regions 69-76.

After the dielectric layer is etched, the second metal layer is deposited across the entire surface. In the preferred embodiment, this metal layer is also aluminum and is also deposited with a thickness of approximately 1 $\mu$m. This second metal layer is then selectively etched to form the metal regions 79-84.

The resistor 12 primarily includes the N+-type well 39. This N+-type region has an area of approximately 30 $\mu$m by 30 $\mu$m and is in contact with the metal regions 62 and 63. The terminal 21 of resistor 12 is at the point where metal region 62 contacts the N+-type well 39. The terminal 16 of resistor 12 is at the point where metal region 63 contacts the N+-type well 39. Both contact points (i.e. terminals 16 and 21) are approximately 2.5 $\mu$m in width and approximately 20 $\mu$m apart from each other.

The capacitor primarily includes the metal region 79, the dielectric region 69, and the metal region 61. Each of these regions has an area of approximately 350 $\mu$m by 350 $\mu$m. The terminal 19 of capacitor 13 is formed by the metal region 61 and is coupled to the ground terminal 18. The terminal 20 of capacitor 13 is formed by the metal region 79.

The metal region 79 of capacitor 13 is coupled to the metal region 62. This is done with the via 78 of the metal region 79. Thus, the terminal 20 of capacitor 13 is coupled with the terminal 21 of resistor 12.

The Schottky diode primarily includes the metal regions 64, 66, 81 and 83, the N-type tub 26, the P+-type wells 34-37, and the N+-type wells 40-42.

The anode 17 of the Schottky diode is formed by the two parallel contact areas 86 and 87 where the metal regions 64 and 66 respectively contact the N-type tub 26. These parallel active areas 86 and 87 are approximately 8 $\mu$m in width and 320 $\mu$m in length. Thus, they form a set of inter-digitized Schottky contact fingers 86 and 87.

The metal region 64 also contacts the P+-type wells 34 and 35 and the metal region 66 also contacts the P+-type wells 36 and 37. The resulting contact fingers 89-92 are each approximately 1 $\mu$m in width and 320 $\mu$m in length and are parallel to each other and to the active contact areas 86 and 87.

The P+-type wells 34-37 are used to increase the reverse breakdown voltage of the Schottky diode 11. The P+-type wells 34 and 35 reduce the electric field between the N+-type wells 40 and 41 and the metal region 64. The P+-type wells 36 and 37 reduce the electric field between the N+-type wells 41 and 42 and the metal region 66. As a result, the paths for reverse breakdown between the metal region 64 and the N+-type wells 40 and 41 and the paths between the metal region 66 and the N+-type wells 41 and 42 are increased. Therefore, a greater reverse voltage is required for a reverse breakdown.

Another advantage to the P+-type regions is that the forward knee voltage can be tailored to meet specific needs. This is done by increasing or decreasing the doping concentrations of the P+-type wells 34-37.

In order to couple the metal regions 64 and 66 of the Schottky diode 11 to the ground terminal 18, the metal regions 81 and 83 are employed. The metal regions 81 and 83 therefore respectively serve as vias for coupling the parallel active contact areas 86 and 87 of the anode 17 to the ground terminal 18.

The cathode 14 of the Schottky diode 11 is formed by the multiple contact areas 94-96 where the N+-type wells 40-42 contact the N-type tub 26. The resulting contact fingers 94-96 have each a width of approximately 4 $\mu$m and a length of approximately 320 $\mu$m and are parallel to each other and to the active area contact fingers 86 and 87. The N+-type wells 40-42 are used for contacting the N-type tub 26 because a direct metal contact to the N-type tub 26 would establish another Schottky contact area.

The field oxide regions 29-33 together with the P+-type wells 34-37 provide separation between the active contact areas 86 and 87 and the N+-type wells 40-42. The field oxide regions 29-32 are each approximately 2 $\mu$m in width and 320 $\mu$m in length and are parallel to the active contact fingers 86 and 87. The P+-type wells 34-37 are each approximately 3 $\mu$m in width and 320 $\mu$m in length and are parallel to the active contact fingers 86 and 87 and the field oxide regions 29-32. Thus, the separation between each of the contact fingers 86 and 87 and one of the N+-type wells 40-42 is approximately 5 $\mu$m in width and 320 $\mu$m in length. In order to reduce the resistance between the active areas 86 and 87 and the N+-type wells 40-42, this separation could be made even smaller. However, this would have the undesirable effect of reducing the reverse breakdown voltage.

The metal region 63 is used in order to couple the N+-type well 40 of the Schottky diode 11 to the N+-type well 39 of the resistor 12. The contact area at each of the N+-type wells 39 and 40 is approximately 2.5 $\mu$m in width. Thus, the metal region 63 couples the contact area 94 of cathode 14 with terminal 16 of the resistor 12.

Furthermore, the metal region 80 is used to couple both the N+-type well 40 of the Schottky diode 11 and the N+-type well 39 of the resistor 12 to the input terminal 15. The metal region 80 therefore serves as a via for coupling the contact area 94 of cathode 14 to the input terminal 15.

The metal regions 65, 67, 82, and 84 are used in order to couple the N+-type wells 41 and 42 of the Schottky diode 11 to the input terminal 15. The metal regions 65 and 67 respectively contact the N+-type wells 41 and 42 at the contact areas 95 and 96. The width of both of these contact areas is approximately 2.5 $\mu$m. Furthermore, the metal regions 82 and 84 respectively contact the metal regions 65 and 67 at a width of approximately 2.5 $\mu$m. Thus, the metal regions 82 and 84 serves as vias for coupling the contact areas 95 and 96 of cathode 14 with the input terminal 15.

The field oxide region 28 provides separation between the N-type tub 26 and the N+-type well 39 and between the N+-type well 40 and the N+-type well 39. Since the field oxide region 28 is approximately 5.5 $\mu$m in width, the separation between the two N+-type wells 39 and 40 is approximately this same width. Furthermore, the separation between the N+-type well 39 and the N-type tub 26 is approximately 3.5 $\mu$m.

The Schottky diode 11 can be configured to draw more current. This is done by making the width of the active contact areas 86 and 87 larger. However, as this width is increased, the associated capacitance at the active contact area is also increased.

In order to remedy such a problem and still provide the Schottky diode 11 with the capability to draw more current, additional parallel Schottky contact fingers can be constructed in the same manner as the contact finger 87. This also requires constructing associated additional N+-type to N-type contact fingers in the same manner as the contact fingers 95 and 96.

As is shown in FIG. 2, the metal regions 79-84 contact the metal regions 61-67 respectively. The metal regions 79-84 do not directly contact the N+-type wells, P+-type wells 34-37, or the N-type tub 26. If this were attempted, undesirable inaccuracies would result from having to etch through both the silicon nitride layer and the second silicon dioxide layer deposited during fabrication.

Figure 3:
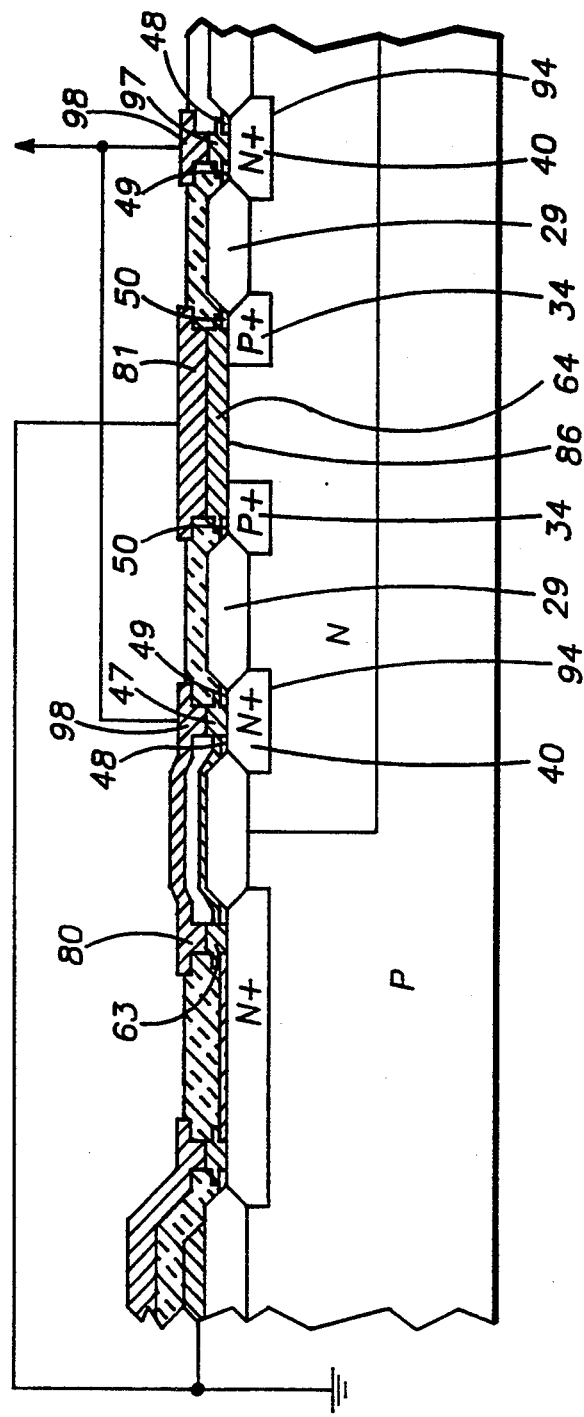
FIG. 3 shows a layout of the present invention employing a single circular Schottky contact finger.

FIG. 3 provides an alternative embodiment of the semiconductor device 10. In this embodiment, the Schottky diode 11 only has a single Schottky active contact area 86 rather than the set of inter-digitized Schottky contact areas 86 and 87 of FIG. 2.

The single active contact area 86 is circular shaped. Thus, the metal regions 64 and 81 are circular shaped as well. Furthermore, the N+-type well 40, the field oxide region 29, the oxide strips 48-50, and the P+-type 34 region are all ring shaped. Thus, the N+-type to N-type contact area 94 is ring shaped as well. In addition, the metal region 63 has a ring shaped portion 97 which contacts the ring shaped N+-type well 40. And, the metal region 81 has a ring shaped portion 98 which contacts the ring shaped portion of the metal region 63. The same type of process is used in fabricating this embodiment as was described earlier for the embodiment in FIG. 2.

Figure 4:
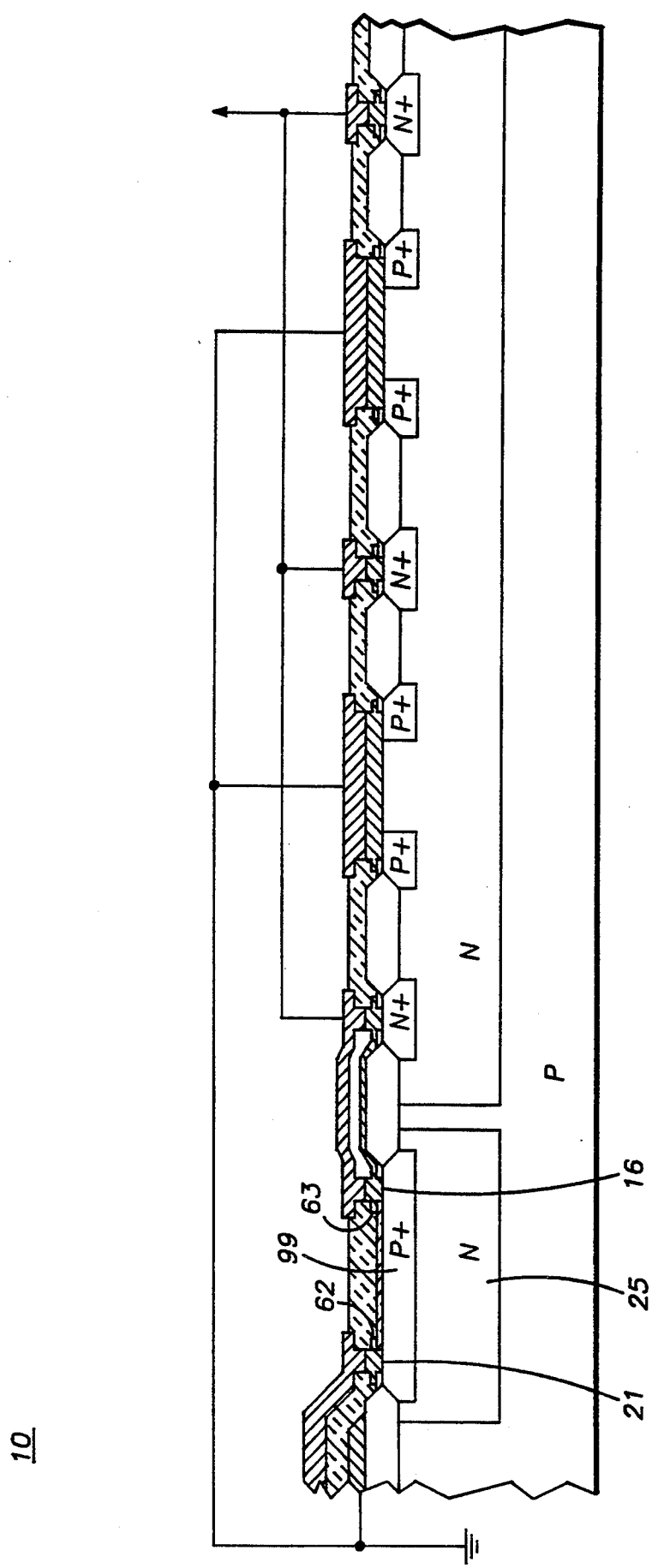
FIG. 4 shows a layout of the present invention employing a resistor comprising a P+-type well formed in an N-type tub.

FIG. 4 provides another embodiment of the semiconductor device 10. In this embodiment, the resistor includes a second N-type tub 25 formed in the P-type substrate 24. And, in the N-type tub 25, there is formed a P+-type well 99. The metal regions 62 and 63 both contact the P+-type well 99. These contacts form the two terminals 21 and 16 of the resistor 12. Otherwise, the connections and the components are the same as in the earlier described embodiment in FIG. 2.

In this embodiment, the second N-type tub 25 is formed at the same time using the same processes and materials as was described earlier for the N-type tube 26. Furthermore, the P+-type well 99 is formed at the same time using the same processes and materials as was described earlier for the P+-type wells 34-37. Otherwise, the fabrication process is the same as that described earlier for the embodiment in FIG. 2.

Figure 5:
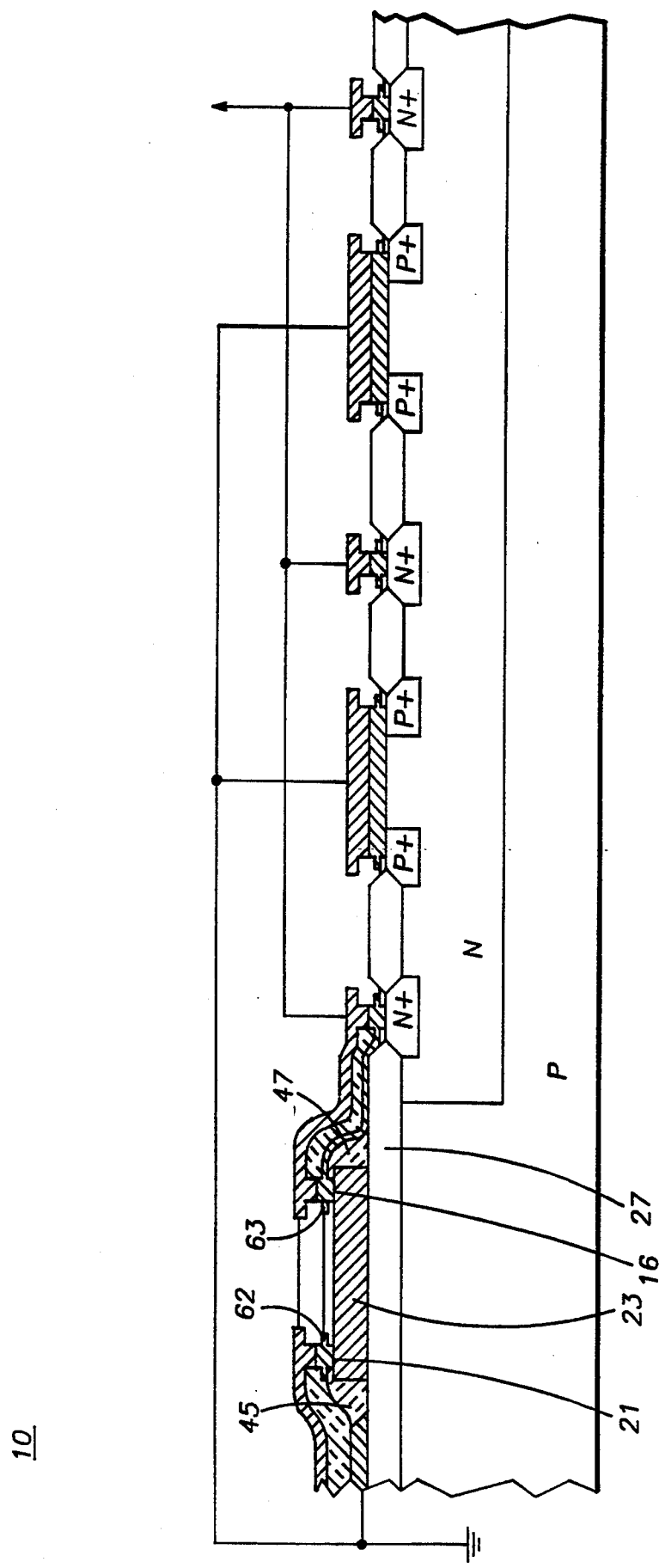
FIG. 5 shows a layout of the present invention employing a resistor comprising a thin film material.

FIG. 5 shows still another embodiment of semiconductor device 11. In this embodiment, the resistor 12 includes the thin film resistive material 23 deposited on the field oxide region 27. The metal regions 62 and 63 both contact the thin film material 23. These contacts form the two terminals 21 and 16 of the resistor 12. Otherwise, the connections and the components are the same as in the earlier described embodiment in FIG. 2.

In this embodiment, the thin film material 23 is deposited onto the field oxide region 27 after the field oxide regions 27 and 29-32 have been formed and after the oxide strips 45 and 47 have been formed. In the preferred embodiment this film material comprises tantalum and is deposited with a thickness of approximately 1 μm. Then, the first metal layer is deposited and the metal regions 61-67 are formed. Otherwise, the fabrication process is the same as that described earlier for the embodiment in FIG. 2.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An integrated semiconductor device comprising:
a resistive region defining a resistor;
a first conductive region in contact with the resistive region so as to define a first terminal of the resistor;
a second conductive region in contact with the resistive region so as to define a second terminal of the resistor;
a third conductive region defining a first plate of a capacitor;
a dielectric region extending above the first conductive region and defining a dielectric portion of the capacitor; and
a fourth conductive region having a first portion extending above the dielectric region and a second portion extending above part of the resistive region and in contact with the first conductive region, the first portion defining a second plate of the capacitor and the second portion coupling the second plate of the capacitor to the first terminal of the resistor.

2. The integrated semiconductor device of claim 1 wherein the resistive region is adjacent to the third conductive region so that the resistor is adjacent to the capacitor.

3. The integrated semiconductor device of claim 2 further comprising an insulating region adjacent to the third conductive region wherein the resistive region is a resistive film formed on the insulating region.

4. The integrated semiconductor device of claim 3 wherein the resistive film comprises tantalum.

5. The integrated semiconductor device of claim 2 further comprising a substrate wherein the resistive region is a doped region formed in the substrate.

6. The integrated semiconductor device of claim 5 wherein the substrate is a P type substrate and the doped region formed in the substrate is an N+ type region.

7. The integrated semiconductor device of claim 2 further comprising a substrate and a doped tub formed in the substrate wherein the resistive region is a doped region oppositely doped to and formed in the doped tub.

8. The integrated semiconductor device of claim 7 wherein the substrate is a P type substrate, the doped tub is an N type tub, and the doped region is a P+ type region.

9. The integrated semiconductor device of claim 1 wherein a dielectric material comprises silicon nitride.

10. The integrated semiconductor device of claim 1 wherein at least one of the first, second, third, and fourth conductive regions comprises aluminum.

11. The integrated semiconductor device of claim 1 further comprising a substrate wherein the first, second, and third conductive regions are formed from a first conductive layer formed above the substrate and the fourth conductive region is formed from a second conductive layer formed above the substrate.

12. The integrated semiconductor device comprising:
a substrate;
a lightly doped tub formed in the substrate;
a first heavily doped region formed in the lightly doped tub so as to define a cathode of a Schottky diode;
a resistive region defining a resistor;
a first conductive region in contact with the resistive region so as to define a first terminal of the resistor;
a second conductive region in contact with the resistive region so as to define a second terminal of the resistor and in contact with the first heavily doped region so as to couple the second terminal of the resistor to the cathode of the Schottky diode;
a third conductive region defining a first plate of a capacitor;
a fourth conductive region in contact with and extending over a portion of the lightly doped tub so as to define an anode of the Schottky diode;
a dielectric region extending above the first conductive region and defining a dielectric portion of the capacitor; and
a fifth conductive region having a first portion extending above the dielectric region and a second portion extending above part of the resistive region and in contact with the first conductive region, the first portion defining a second plate of the capacitor and the second portion coupling the second plate of the capacitor to the first terminal of the resistor.

13. The integrated semiconductor device of claim 12 wherein the first conductive region is adjacent to the third conductive region so that the resistor is adjacent to the capacitor and wherein the second conductive region is adjacent to the heavily doped region so that the resistor is also adjacent to the Schottky diode.

14. The integrated semiconductor device of claim 12 wherein the substrate is a P type substrate, the lightly doped tub is an N type tub, and the first heavily doped region is an N+ type region.

15. The integrated semiconductor device of claim 12 further comprising at least one additional heavily doped region formed in the lightly doped tub so that the first heavily doped region and the at least one additional heavily doped region together define the cathode of the Schottky diode.

16. The integrated semiconductor device of claim 15 further comprising at least one additional conductive region, each of the at least one additional conductive regions being in contact with a corresponding one of the at least one additional heavily doped regions, the at least one additional conductive regions and the second conductive region coupled together so that the cathode of the Schottky diode is coupled to the second terminal of the resistor.

17. The integrated semiconductor device of claim 12 wherein the first, second, third, and fourth conductive regions are formed from a first conductive layer formed above the substrate and the fifth conductive region is formed from a second conductive layer formed above the substrate.

18. The integrated semiconductor device of claim 16 wherein the first, second, third, fourth, and at least one additional conductive regions are formed from a first conductive layer formed above the substrate and the fifth conductive region is formed from a second conductive layer formed above the substrate.

19. A method of fabricating an integrated semiconductor device comprising steps of:
   forming a resistive region defining a resistor;
   forming a first conductive region in contact with the resistive region so as to define a first terminal of the resistor;
   forming a second conductive region in contact with the resistive region so as to define a second terminal of the resistor;
   forming a third conductive region defining a first plate of a capacitor;
   forming a dielectric region extending above the first conductive region and defining the dielectric portion of the capacitor; and
   forming a fourth conductive region having a first portion extending above the dielectric region and a second portion in contact with the first conductive region, the first portion defining the second plate of the capacitor and a second portion coupling the second plate of the capacitor to the first terminal of the resistor.

20. The method of claim 19 wherein the third conductive region is formed adjacent to the resistive region in the step of forming the third conductive region so that the resistor is adjacent to the capacitor.

21. The method of claim 20 wherein the step of forming the resistive region includes steps of:
   forming an insulating region adjacent to the third conductive region; and
   forming a resistive film on the insulating region so as to define the resistive region.

22. The method of claim 20 wherein the step of forming the resistive region includes a step of forming in a substrate a doped region so as to define the resistive region.

23. The method of claim 20 wherein the step of forming the resistive region includes steps of:
   forming a doped tub in a substrate; and
   forming in the doped tub an oppositely doped region so as to define the resistive region.

24. The method of claim 19 further comprising a step of forming a first conductive layer above a substrate wherein the first, second, and third conductive regions are formed from the first conductive layer in the steps of forming the first, second, and third conductive regions.

25. The method of claim 24 further comprising a step of forming a second conductive layer above the substrate wherein the fourth conductive region is formed from the second conductive layer in the step of forming the fourth conductive region.

26. A method of fabricating an integrated semiconductor device comprising steps of:
   forming a lightly doped tub in a substrate;
   forming a first heavily doped region in the lightly doped tub so as to define the cathode of a Schottky diode;
   forming a resistive region defining a resistor;
   forming a first conductive region in contact with the resistive region so as to define a first terminal of the resistor;
   a second conductive region in contact with the resistive region so as to define a second terminal of the resistor and in contact with the first heavily doped region so as to couple the second terminal of the resistor to a cathode of the Schottky diode;
   a third conductive region defining a first plate of a capacitor;
   a fourth conductive region in contact with and extending over a portion of the lightly doped tub so as to define an anode of the Schottky diode;
   forming a dielectric region extending above the first conductive region and defining a dielectric portion of the capacitor; and
   forming a fifth conductive region having a first portion extending above the dielectric region and a second portion in contact with the first conductive region, the first portion defining the second plate of the capacitor and a second portion coupling the second plate of the capacitor to the first terminal of the resistor.

27. The method of claim 26 wherein:
   the third conductive region is formed adjacent to the resistive region in the step of forming the third conductive region so that the resistor is adjacent to the capacitor; and
   the second conductive region is formed adjacent to the heavily coped well in the step of forming the second conductive region so that the resistor is also adjacent to the Schottky diode.

28. The method of claim 26 further comprising a step of forming a first conductive layer above a substrate wherein the first, second, third, and fourth conductive regions are formed from the first conductive layer in the steps of forming the first, second, third, and fourth conductive regions.

29. The method of claim 28 further comprising a step of forming a second conductive layer above the substrate wherein the fifth conductive region is formed from the second conductive layer in the step of forming the fifth conductive region.

* * * * *

UNITED STATES PATENT AND TRADEMARK OFFICE
CERTIFICATE OF CORRECTION

PATENT NO.   :   5,355,014
DATED        :   October 11, 1994
INVENTOR(S)  :   BHASKER RAO, et al.

It is certified that error appears in the above-indentified patent and that said Letters Patent is hereby corrected as shown below:

IN THE DRAWINGS

In Figure 2, replace the reference numeral "44" with --49-- and replace the second occurrence from the left of the reference numeral "50" with --30--.

Signed and Sealed this

Twenty-first Day of March, 1995

Attest:

BRUCE LEHMAN

Attesting Officer          Commissioner of Patents and Trademarks